United States Patent
Ito et al.

(10) Patent No.: US 11,523,521 B2
(45) Date of Patent: Dec. 6, 2022

(54) MULTILAYER BOARD AND METHOD OF MANUFACTURING THE SAME

(71) Applicant: Murata Manufacturing Co., Ltd., Nagaokakyo (JP)

(72) Inventors: Shingo Ito, Nagaokakyo (JP); Kanto Iida, Nagaokakyo (JP); Naoki Gouchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 987 days.

(21) Appl. No.: 16/257,148

(22) Filed: Jan. 25, 2019

(65) Prior Publication Data

US 2019/0159347 A1 May 23, 2019

Related U.S. Application Data

(63) Continuation of application No. PCT/JP2017/028207, filed on Aug. 3, 2017.

(30) Foreign Application Priority Data

Aug. 18, 2016 (JP) .............................. JP2016-160591

(51) Int. Cl.
  *H05K 1/03* (2006.01)
  *H05K 3/46* (2006.01)
  *H05K 1/16* (2006.01)
  *H01F 41/04* (2006.01)
  *B32B 15/04* (2006.01)
  (Continued)

(52) U.S. Cl.
  CPC ........... *H05K 3/4652* (2013.01); *B32B 15/04* (2013.01); *B32B 15/20* (2013.01); *C08J 5/24* (2013.01); *H01F 17/0013* (2013.01); *H01F 41/041* (2013.01); *H05K 1/024* (2013.01); *H05K 1/032* (2013.01); *H05K 1/0373* (2013.01); *H05K 1/16* (2013.01); *H05K 1/165* (2013.01);
  (Continued)

(58) Field of Classification Search
  CPC ....... H05K 1/144; H05K 1/0313; H05K 1/032
  See application file for complete search history.

(56) References Cited

U.S. PATENT DOCUMENTS

| 2004/0039127 A1 | 2/2004 | Amou et al. |
| 2011/0211321 A1 | 9/2011 | Oikawa |
| 2014/0333407 A1 | 11/2014 | Otsubo |

FOREIGN PATENT DOCUMENTS

| JP | 08-32235 A | 2/1996 |
| JP | 09-181447 A | 7/1997 |

(Continued)

OTHER PUBLICATIONS

Official Communication issued in corresponding Japanese Patent Application No. 2018-534338, dated Jun. 25, 2019.

(Continued)

*Primary Examiner* — Jeremy C Norris
(74) *Attorney, Agent, or Firm* — Keating & Bennett, LLP

(57) ABSTRACT

A method of manufacturing a multilayer board includes forming conductor patterns on four or more insulating base material layers, forming a multilayer body by stacking the insulating base material layers in a state in which the conductor patterns face each other with prepreg layers therebetween, and heat-pressing the multilayer body. In a state before the step of heat-pressing, among the prepreg layers, a thickness of an outermost prepreg layer is larger than a thickness of a prepreg layer other than the outermost prepreg layer.

6 Claims, 7 Drawing Sheets

(51) Int. Cl.
    *B32B 15/20*     (2006.01)
    *C08J 5/24*     (2006.01)
    *H01F 17/00*     (2006.01)
    *H05K 1/02*     (2006.01)
    *H01F 27/28*     (2006.01)

(52) U.S. Cl.
    CPC ....... *H05K 3/46* (2013.01); *H01F 2027/2809* (2013.01); *H05K 2201/0195* (2013.01)

(56) References Cited

FOREIGN PATENT DOCUMENTS

| | | |
|---|---|---|
| JP | 2001-212823 A | 8/2001 |
| JP | 2001-250722 A | 9/2001 |
| JP | 2004-087639 A | 3/2004 |
| WO | 2010/050193 A1 | 5/2010 |
| WO | 2012/124421 A1 | 9/2012 |
| WO | 2013/146568 A1 | 10/2013 |

OTHER PUBLICATIONS

Official Communication issued in International Patent Application No. PCT/JP2017/028207, dated Oct. 31, 2017.

MULTILAYER BOARD AND METHOD OF MANUFACTURING THE SAME

CROSS REFERENCE TO RELATED APPLICATIONS

This application claims the benefit of priority to Japanese Patent Application No. 2016-160591 filed on Aug. 18, 2016 and is a Continuation Application of PCT Application No. PCT/JP2017/028207 filed on Aug. 3, 2017. The entire contents of each application are hereby incorporated herein by reference.

BACKGROUND OF THE INVENTION

1. Field of the Invention

The present invention relates to a multilayer board that includes a stack of insulating base material layers on which conductor patterns are provided, and a method of manufacturing the multilayer board.

2. Description of the Related Art

Japanese Unexamined Patent Application Publication No. 2001-212823 discloses a multilayer printed circuit board in which a plurality of types of circuit boards are stacked with insulating layers, which are formed of cured prepregs, therebetween. In order to obtain a multilayer printed circuit board in which the thicknesses of insulation layers, which are formed from prepregs, are substantially uniform, Japanese Unexamined Patent Application Publication No. 2001-212823 describes the following: two or more types of prepregs, which are made of the same base material and have different amounts of resin, are used; and regarding a prepreg to be interposed between adjacent circuit boards, consideration is given to the amount of resin that is necessary to fill circuits of the circuit boards that the prepreg contacts.

As described in Japanese Unexamined Patent Application Publication No. 2001-212823, in a multilayer board in which circuit boards are stacked with prepreg layers therebetween, the prepregs are more likely to deform than circuit-board forming substrates (base materials) when being heat-pressed. Therefore, it is difficult to control variations in thicknesses of prepreg layers in a simultaneous stacking step when manufacturing a multilayer board.

The inventors of the present invention discovered that, in the simultaneous stacking step when manufacturing the multilayer board, stress is likely to be applied near a surface of a multilayer body, an outermost prepreg layer of the multilayer body becomes thin, and a short circuit may occur between conductor patterns that face each other. An example of this will be described as a comparative example in the description of preferred embodiments of the present invention.

SUMMARY OF THE INVENTION

Preferred embodiments of the present invention provide multilayer boards in each of which negative effects, such as a short circuit between conductor patterns, due to nonuniform variations in thickness of prepreg layers are reduced or prevented, and also provide methods of manufacturing the multilayer boards.

A method of manufacturing a multilayer board according to a preferred embodiment of the present invention includes a step of forming conductor patterns on four or more insulating base material layers, a step of forming a multilayer body by simultaneously stacking the insulating base material layers in a state in which the conductor patterns face each other with a plurality of prepreg layers therebetween and in which the conductor patterns that face each other with the prepreg layers therebetween include portions that overlap at a same or substantially same position as viewed in a stacking direction of the insulating base material layers and the prepreg layers, and a step of heat-pressing the multilayer body. In a state before the step of heat-pressing, among the plurality of prepreg layers, a thickness of an outermost prepreg layer is larger than a thickness of a prepreg layer other than the outermost prepreg layer.

A multilayer board according to a preferred embodiment of the present invention includes four or more insulating base material layers, conductor patterns provided on the insulating base material layers, and a plurality of prepreg layers that define joining layers that join the insulating base material layers to each other. The conductor patterns are provided on surfaces of the insulating base material layers that contact both surfaces of an outermost prepreg layer among the plurality of prepreg layers. Among the plurality of prepreg layers, a thickness of the outermost prepreg layer is larger than a thickness of an inner prepreg layer other than the outermost prepreg layer. The conductor patterns that contact both surfaces of the outermost prepreg layer face each other with the outermost prepreg layer therebetween. The conductor patterns that contact both surfaces of the inner prepreg layer face each other with the inner prepreg layer therebetween. The conductor patterns that face each other with the outermost prepreg layer therebetween and the conductor patterns that face each other with the inner prepreg layer therebetween include portions that overlap at a same or substantially same position as viewed in a stacking direction of the insulating base material layers and the prepreg layers.

With the method described above, the thickness of the outermost prepreg layer does not become too small, and a short circuit between the conductor patterns is prevented.

Moreover, in the multilayer board having this structure, although the conductor patterns are likely to be located close to each other as the thicknesses of the prepreg layers are reduced, a reduction in the thickness of the outermost prepreg layer is effectively avoided, and a short circuit between the conductor patterns is prevented.

The conductor patterns that contact the prepreg layers may define a coil that has a coil axis in the stacking direction of the insulating base material layers and the prepreg layers. In this case, although the coil is a helical coil in which the interlayer distances between the conductor patterns are likely to become small, a short circuit between the conductor patterns is prevented.

Preferably, a relative dielectric constant of the prepreg layers is smaller than a relative dielectric constant of the insulating base material layers. In this case, even if the interlayer distances between the conductor patterns vary due to variations in thickness of the prepreg layers, a change in capacitance generated between the conductor patterns relative to the variations in interlayer distance between the conductor patterns is small. Therefore, components (multilayer boards) among which variations in electrical characteristics are small are obtained.

With preferred embodiments of the present invention, multilayer boards in each of which negative effects due to nonuniform variations in thickness of prepreg layers are reduced or prevented are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the accompanying drawings.

First Preferred Embodiment

Figure 1:
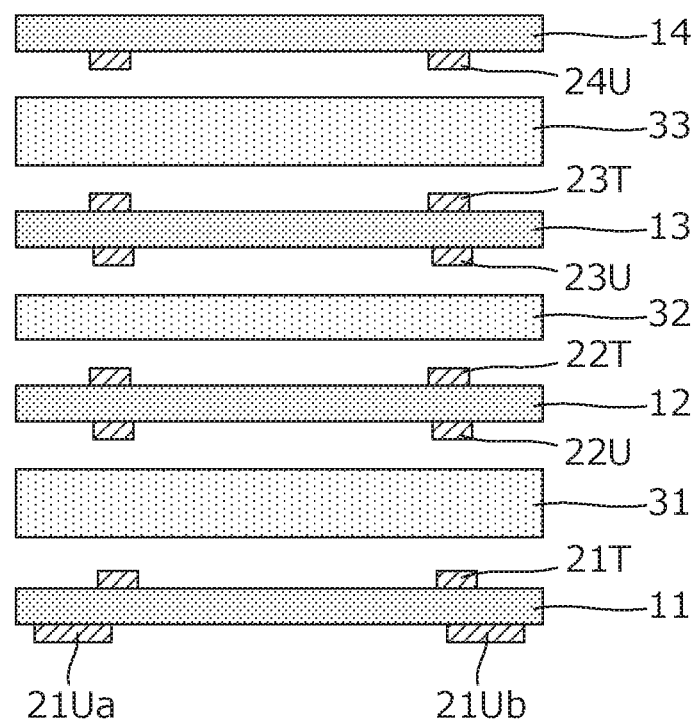
FIG. 1 is a sectional view of a multilayer board according to a first preferred embodiment of the present invention before stacking.
Figure 2:
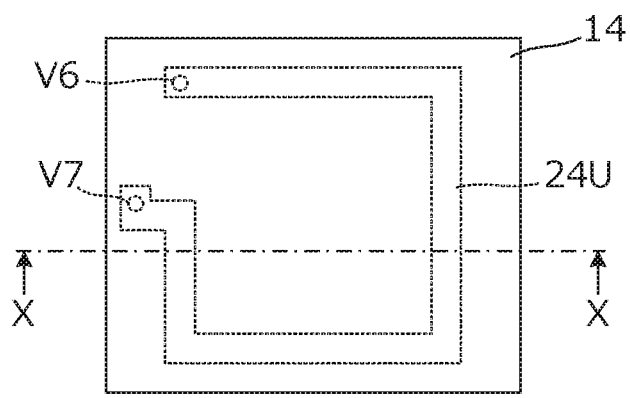
FIG. 2 is a plan view of conductor patterns provided on each insulating base material layer of a multilayer board according to the first preferred embodiment of the present invention.
Figure 2:
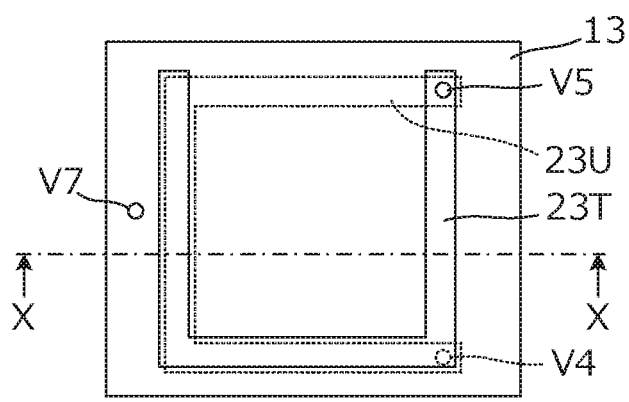
Figure 2:
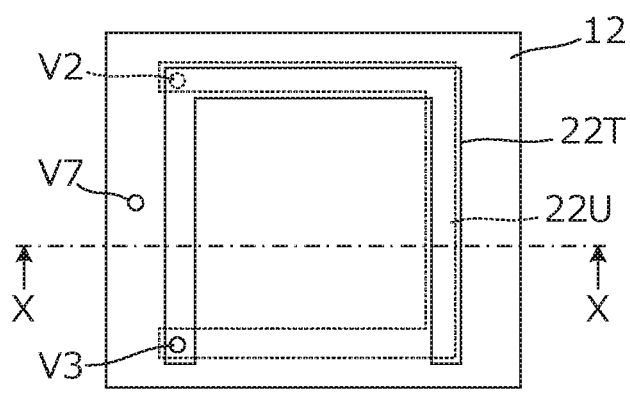
Figure 2:
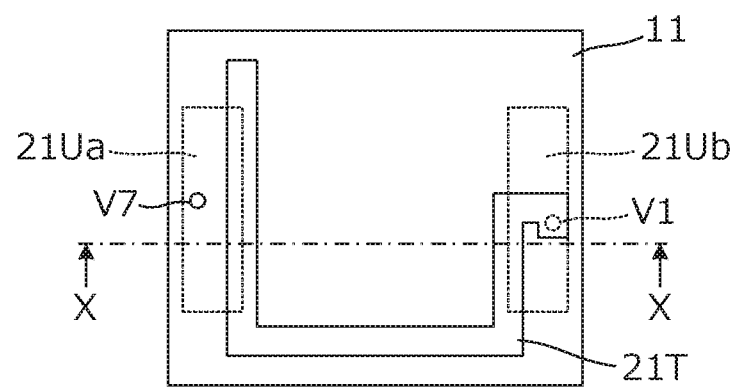
Figure 3:
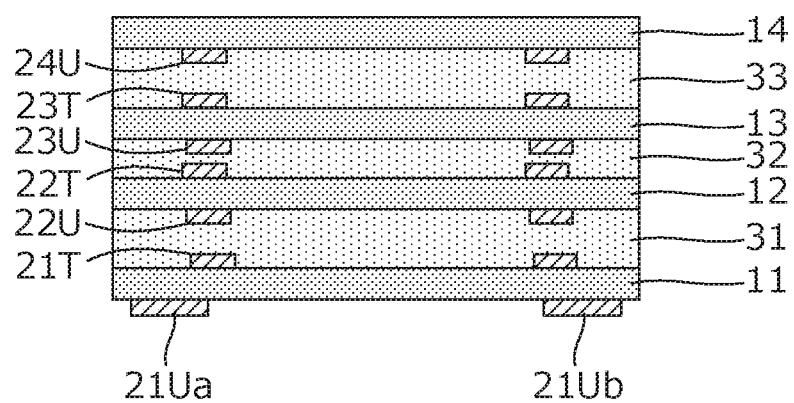
FIG. 3 is a sectional view of a multilayer board according to the first preferred embodiment of the present invention.

FIG. 1 is a sectional view of a multilayer board according to a first preferred embodiment of the present invention before stacking. FIG. 2 is a plan view of conductor patterns provided on each insulating base material layer. FIG. 3 is a sectional view of a multilayer board 101 according to the present preferred embodiment.

The multilayer board 101 includes insulating base material layers 11, 12, 13, and 14 and prepreg layers 31, 32, and 33. Conductor patterns 21Ua and 21Ub are provided on the undersurface of the insulating base material layer 11, and a conductor pattern 21T is provided on the top surface of the insulating base material layer. A conductor pattern 22U is provided on the undersurface of the insulating base material layer 12, and a conductor pattern 22T is provided on the top surface of the insulating base material layer 12. A conductor pattern 23U is provided on the undersurface of the insulating base material layer 13, and a conductor pattern 23T is provided on the top surface of the insulating base material layer 13. A conductor pattern 24U is provided on the undersurface of the insulating base material layer 14.

As represented in FIG. 2, a via hole V1, which provides interlayer connection between the conductor pattern 21Ub on the undersurface and the conductor pattern 21T on the top surface, is provided in the insulating base material layer 11. A via hole V3, which provides interlayer connection between the conductor pattern 22U on the undersurface and the conductor pattern 22T on the top surface, is provided in the insulating base material layer 12. A via hole V5, which provides interlayer connection between the conductor pattern 23U on the undersurface and the conductor pattern 23T on the top surface, is provided in the insulating base material layer 13.

Although prepreg layers are not illustrated in FIG. 2, a via hole V2 is provided in the prepreg layer 31, a via hole V4 is provided in the prepreg layer 32, and a via hole V6 is provided in the prepreg layer 33. A via hole V7 is provided in each of the insulating base material layers 13, 12, and 11 and the prepreg layers 33, 32, and 31.

As represented in FIG. 1, conductor patterns contact both surfaces of outermost prepreg layers among the plurality of prepreg layers 31, 32, and 33. In this example, the conductor patterns 21T and 22U contact the outermost prepreg layer 31, and the conductor patterns 23T and 24U contact the other outermost prepreg layer 33. Among the plurality of prepreg layers 31, 32, and 33, the thicknesses of the outermost prepreg layers 31 and 33 are larger than the thickness of the other prepreg layer 32.

A non-limiting example of a method of manufacturing the multilayer board 101 according to the present preferred embodiment is as follows.

For example, Cu foils are affixed to the insulating base material layers 11, 12, 13, and 14 preferably of, for example, the flame retardant type 4 (FR-4), and conductor patterns are formed by patterning the Cu foils by photolithography. The via holes V1, V3, V5, and V7 are formed in the insulating base material layers 11, 12, and 13. Moreover, the via holes V2, V4, V6, and V7 are formed in the prepreg layers 31, 32, and 33.

In FIGS. 1, 2, and 3, a coil portion of one unit is illustrated. In practice, however, processing of each step is performed in state of a collective board that includes a plurality of element-forming portions (manufacturing is performed by a large-size process), and the collective board is divided into pieces.

As illustrated in FIG. 1, a multilayer body is formed by stacking the insulating base material layers 11, 12, 13, and 14 in a state in which the conductor patterns face each other with the prepreg layers 31, 32, and 33 therebetween. The prepreg layers 31, 32, and 33 are each preferably, for example, a thermosetting adhesive, including a fluororesin. The relative dielectric constant of the insulating base material layers 11, 12, 13, and 14 is preferably, for example, about 3.0 or higher and about 4.0 or lower. In contrast, the relative dielectric constant of the prepreg layers 31, 32, and 33 is preferably, for example, about 2.0 or higher and about 2.5 or lower, which is relatively low.

Preferably, the multilayer body is heated in a temperature range of, for example, about 150° C. or higher and lower than about 300° C., and is pressed with a pressure of about 4 MPa or higher and lower than about 10 MPa, for example.

In a state before the heat-pressing step, among the plurality of prepreg layers 31, 32, and 33, the thicknesses of the outermost prepreg layers 31 and 33 are larger than the thickness of the prepreg layer 32. Accordingly, after the heat-pressing step, as illustrated in FIG. 3, the thicknesses of the outermost prepreg layers 31 and 33 do not become smaller than the thickness of the inner prepreg layer 32. As a result, a multilayer board in which negative effects due to nonuniform variations in thickness of prepreg layers are reduced or prevented is obtained.

If the thicknesses of all of the prepreg layers were made large beforehand, the thickness of the multilayer board would become large. Moreover, the entirety of the multilayer body would become thick, fluidity during heat-pressing would become unnecessarily high, and variations in positions of the conductor patterns in the multilayer body would become large.

The conductor patterns 21Ua and 21Ub, which are provided on the undersurface of the insulating base material layer 11, are terminal electrodes. One rectangular helical coil is provided along the path of the conductor pattern 21Ub→the via hole V1→the conductor pattern 21T→the via hole V2→the conductor pattern 22U→the via hole V3→the conductor pattern 22T→the via hole V4→the conductor pattern 23U→the via hole V5→the conductor pattern 23T→the via hole V6→the conductor pattern 24U→the via hole V7→the conductor pattern 21Ua.

Figure 6:
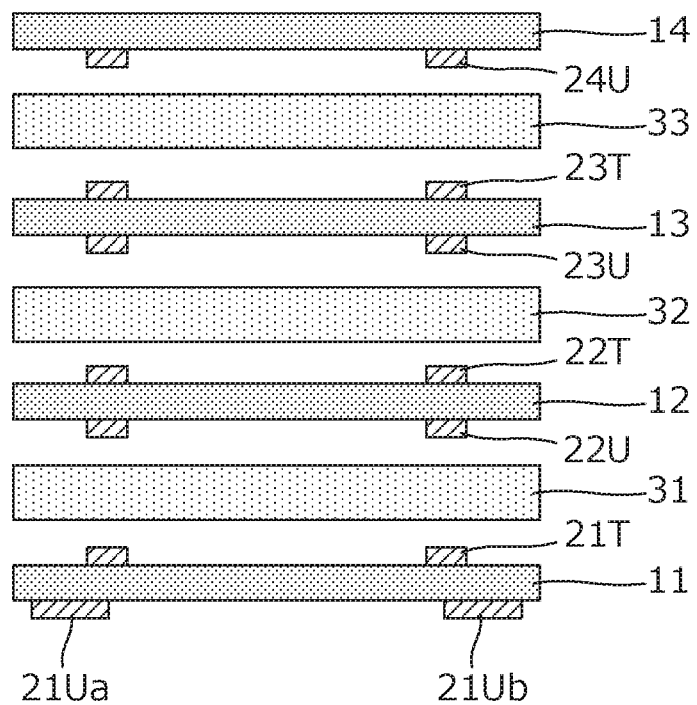
FIG. 6 is a sectional view of a multilayer board according to a comparative example before stacking.
Figure 7A:
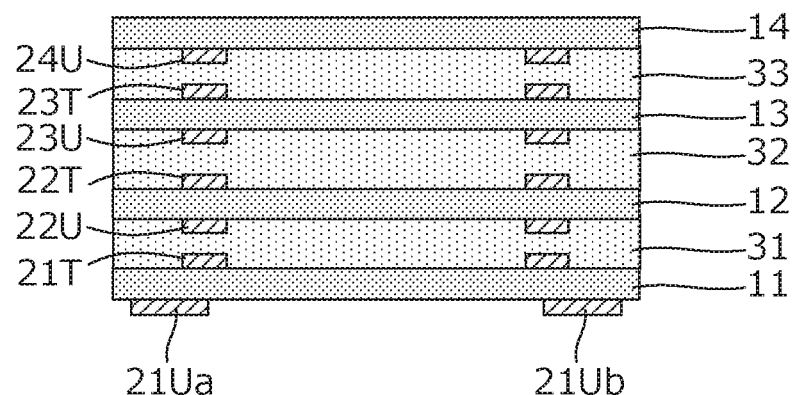
FIGS. 7A and 7B are sectional views of a multilayer board according to the comparative example.
Figure 7B:
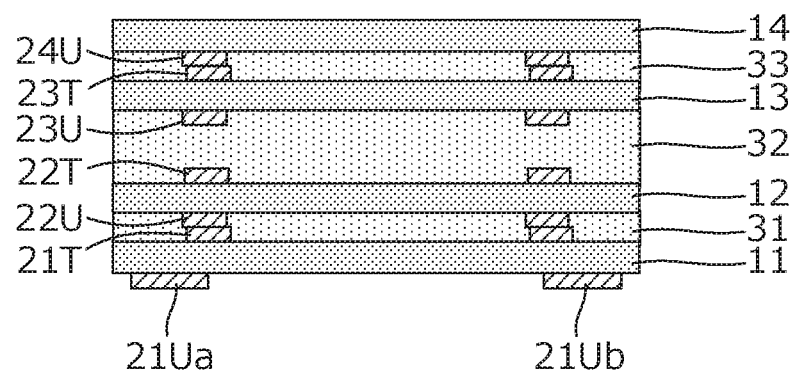

Here, referring to FIGS. 6, 7A, and 7B, a multilayer board according to a comparative example will be described. FIG. 6 is a sectional view of a multilayer board according to the comparative example before stacking. FIGS. 7A and 7B are sectional views of a multilayer board according to the comparative example. In contrast to the multilayer board of the present preferred embodiment illustrated in FIG. 1, the thicknesses of all of the prepreg layers 31, 32, and 33 before heat-pressing are the same or substantially the same. When the insulating base material layers 11, 12, 13, and 14 and the prepreg layers 31, 32, and 33 illustrated in FIG. 6 are stacked and heat-pressed, in particular, the outermost prepreg layers are heated first and become fluid. Therefore, the thicknesses of the prepreg layers 31 and 33 are likely to vary depending on conditions. In the example illustrated in FIG. 7A, a short circuit between conductor patterns has not occurred. However, in the example illustrated in FIG. 7B, the conductor pattern 23T and the conductor pattern 24U are short-circuited.

In this manner, in the existing multilayer board and a method of manufacturing the multilayer board, the distances between the conductor patterns in the stacking direction are likely to vary due to nonuniform variations in thickness of prepreg layers, and a short circuit between the conductor patterns may occur. In contrast, with the present preferred embodiment, as described above, the thicknesses of the outermost prepreg layers 31 and 33 do not become smaller than the thickness of the prepreg layer 32, and a multilayer board in which negative effects due to nonuniform variations in thickness of prepreg layers are reduced or prevented is obtained.

The present preferred embodiment has the following advantageous effects, in addition to the advantageous effects described above. Although the coil is a helical coil, in which the interlayer distances between the conductor patterns are likely to become small, that is, although including conductor patterns in which stress concentration is likely to occur in overlapping portions of the conductor patterns that overlap in plan view, a short circuit between the conductor patterns is prevented. Moreover, because the relative dielectric constant of the prepreg layers 31, 32, and 33 is smaller than the relative dielectric constant of the insulating base material layers 11, 12, 13, and 14, changes in capacitance generated between the conductor patterns relative to variations in interlayer distance between the conductor patterns due to variations in thickness of prepreg layers are small. Therefore, components (multilayer boards) among which variations in electrical characteristics are small are obtained. Moreover, the thicknesses of the prepreg layers are easily made uniform, the interlayer distances between the conductor patterns become uniform, and stable electrical characteristics in which, for example, variations in inductance of the coil are small are obtained.

Second Preferred Embodiment

In a second preferred embodiment of the present invention, an example in which the structures of a plurality of insulating base material layers and conductor patterns provided thereon differ from those of the first preferred embodiment will be described.

Figure 4:
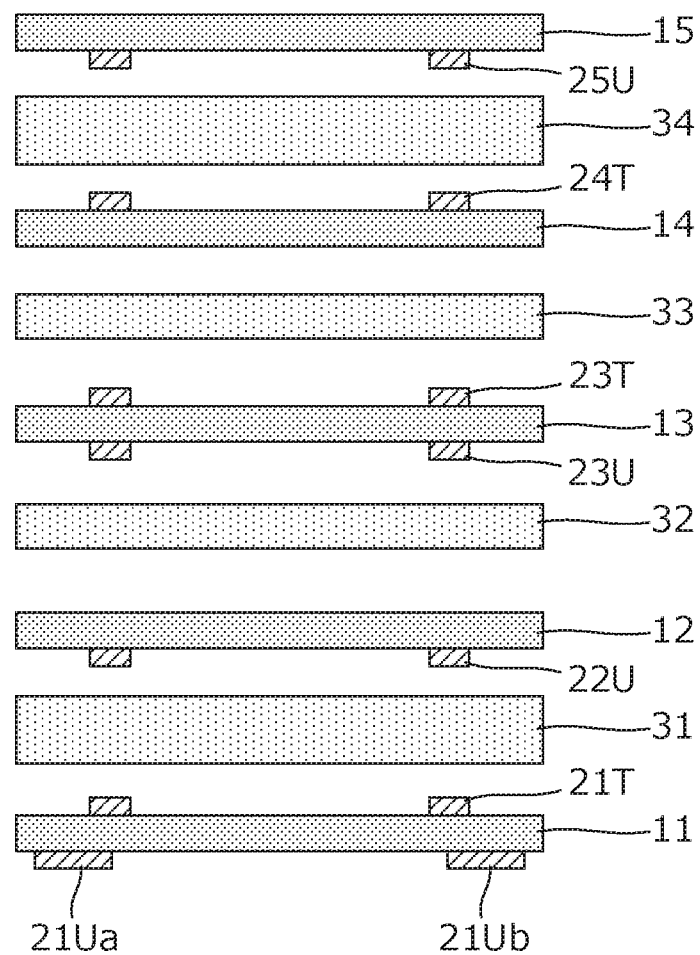
FIG. 4 is a sectional view of a multilayer board according to a second preferred embodiment of the present invention before stacking.
Figure 5:
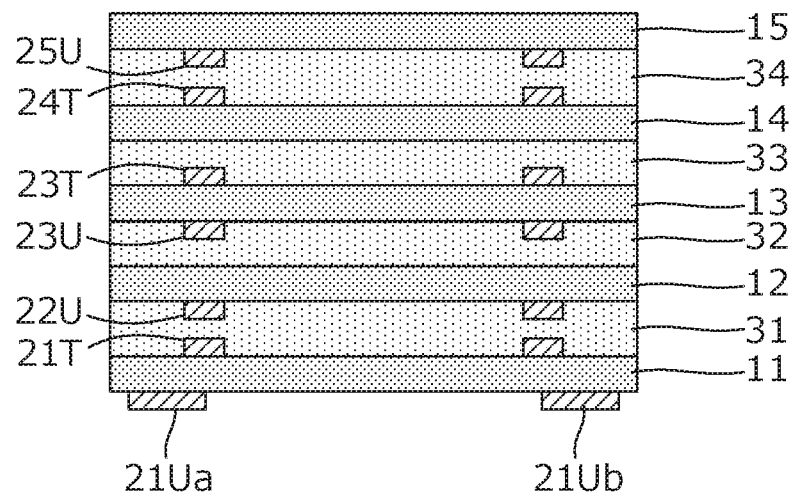
FIG. 5 is a sectional view of a multilayer board according to the second preferred embodiment of the present invention.

FIG. 4 is a sectional view of a multilayer board according to the second preferred embodiment before stacking. FIG. 5 is a sectional view of a multilayer board 102 according to the second preferred embodiment.

The multilayer board 102 includes insulating base material layers 11, 12, 13, 14, and 15 and prepreg layers 31, 32, 33, and 34. Conductor patterns 21Ua and 21Ub are provided on the undersurface of the insulating base material layer 11, and a conductor pattern 21T is provided on the top surface of the insulating base material layer 11. A conductor pattern 22U is provided on the undersurface of the insulating base material layer 12. A conductor pattern 23U is provided on the undersurface of the insulating base material layer 13, and a conductor pattern 23T is provided on the top surface of the insulating base material layer 13. A conductor pattern 24T is provided on the top surface of the insulating base material layer 14. A conductor pattern 25U is provided on the undersurface of the insulating base material layer 15.

As represented in FIG. 5, conductor patterns contact both surfaces of the outermost prepreg layers 31 and 34 among the plurality of prepreg layers 31, 32, 33, and 34. In this example, the conductor patterns 21T and 22U contact both surfaces of the outermost prepreg layer 31, and the conductor patterns 24T and 25U contact both surfaces of the other outermost prepreg layer 34. Among the plurality of prepreg layers 31, 32, 33, and 34, the thicknesses of the outermost prepreg layers 31 and 34 are larger than the thicknesses of the other prepreg layers 32 and 33.

Also in the present preferred embodiment, the multilayer board 102 illustrated in FIG. 5 is manufactured by performing the conductor pattern forming step, the stacking step, and the heat-pressing step, which have been described above in the first preferred embodiment.

Due to the heat-pressing step, the thicknesses of the outermost prepreg layers 31 and 34 are reduced. However, as illustrated in FIG. 5, the thicknesses of the outermost prepreg layers 31 and 34 do not become smaller than the thicknesses of the inner prepreg layers 32 and 33, and a multilayer board in which negative effects due to nonuniform variations in thickness of prepreg layers are reduced or prevented is obtained.

In the present preferred embodiment, it is sufficient for each of the prepreg layers 32 and 33, only one surface of which contacts a conductor pattern, to have a thickness that is necessary to join insulating base material layers to each other. Therefore, the thicknesses of the prepreg layers 32 and 33 may be made sufficiently smaller than those of the outermost prepreg layers 31 and 34, both surfaces of which contact the conductor patterns.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer board comprising:

four or more insulating base material layers;

conductor patterns provided on the insulating base material layers; and a plurality of prepreg layers that join the insulating base material layers to each other; wherein the conductor patterns are provided on surfaces of the insulating base material layers that contact both surfaces of an outermost prepreg layer among the plurality of prepreg layers;

among the plurality of prepreg layers, a thickness of the outermost prepreg layer is larger than a thickness of an inner prepreg layer other than the outermost prepreg layer;

the conductor patterns that contact both surfaces of the outermost prepreg layer face each other with the outermost prepreg layer therebetween;

the conductor patterns that contact both surfaces of the inner prepreg layer face each other with the inner prepreg layer therebetween; and the conductor patterns that face each other with the outermost prepreg layer therebetween and the conductor patterns that face each other with the inner prepreg layer therebetween include portions that overlap at a same or substantially same position as viewed in a stacking direction of the insulating base material layers and the prepreg layers.

2. The multilayer board according to claim 1, wherein the conductor patterns that contact the prepreg layers define a coil that has a coil axis in the stacking direction of the insulating base material layers and the prepreg layers.

3. The multilayer board according to claim 1, wherein a relative dielectric constant of the prepreg layers is smaller than a relative dielectric constant of the insulating base material layers.

4. The multilayer board according to claim 3, wherein the relative dielectric constant of the prepreg layers is about 2.0 or higher and about 2.5 or lower; and the relative dielectric constant of the insulating base material layers is about 3.0 or higher and about 4.0 or lower.

5. The multilayer board according to claim 1, wherein the prepreg layers are made of a thermosetting adhesive including fluororesin.

6. The multilayer board according to claim 1, wherein the conductor patterns are made of Cu foil.

* * * * *